United States Patent [19]

Kirsch

[11] Patent Number: 5,266,512
[45] Date of Patent: Nov. 30, 1993

[54] METHOD FOR FORMING A NESTED SURFACE CAPACITOR

[75] Inventor: Howard C. Kirsch, Austin, Tex.

[73] Assignee: Motorola, Inc., Schaumburg, Ill.

[21] Appl. No.: 781,691

[22] Filed: Oct. 23, 1991

[51] Int. Cl.$^5$ .................. H01L 21/70; H01L 27/00
[52] U.S. Cl. ........................ 437/52; 437/60; 437/919
[58] Field of Search .......... 437/47, 52, 60, 919, 437/228; 156/643; 257/309, 310, 311-313; 365/185, 149

[56] References Cited

U.S. PATENT DOCUMENTS

| | | | |
|---|---|---|---|
| 5,047,815 | 9/1991 | Yasuhira et al. | 357/23.6 |
| 5,047,817 | 9/1991 | Wakamiya et al. | 357/23.6 |
| 5,061,650 | 10/1991 | Dennison et al. | 437/47 |
| 5,084,405 | 1/1992 | Fazan et al. | 437/47 |
| 5,126,280 | 6/1992 | Chan et al. | 437/919 |
| 5,185,282 | 2/1993 | Lee et al. | 437/52 |

FOREIGN PATENT DOCUMENTS

| | | | |
|---|---|---|---|
| 1-74752 | 3/1989 | Japan | 437/919 |
| 2-260453 | 10/1990 | Japan | 437/52 |

OTHER PUBLICATIONS

Kaga et al. "Crown Shaped Stack Capacitor Cell For 1.5-V Operation 64 Mb DRAM's-IEEE Transactions on Electron Device", vol. 38, No. 2, Feb. 1991, pp. 255-261.

Primary Examiner—Olik Chaudhuri
Assistant Examiner—H. Jey Tsai
Attorney, Agent, or Firm—Keith E. Witek

[57] ABSTRACT

A nested surface capacitor and method of formation. The nested surface capacitor has a substrate (14) and an overlying dielectric layer (16). Conductive layer (18) overlies the dielectric layer (16). Three conductive cylindrical structures respectively referred to as an inner cylinder (30), a central cylinder (22') and an outer cylinder (32) overlie the conductive layer (18). The inner cylinder (30) lies within the central cylinder (22'). The central cylinder (22') lies within the outer cylinder (32). Together, the conductive layer (18) and the cylinders (30, 22', and 32) form a first electrode for the nested surface capacitor. A dielectric layer (38) overlying the cylinders (30, 22', and 32) and the conductive layer (18) acts as a capacitor dielectric. A conductive layer (40) overlying the dielectric layer (38) forms a second electrode of the capacitor.

17 Claims, 8 Drawing Sheets

METHOD FOR FORMING A NESTED SURFACE CAPACITOR

FIELD OF THE INVENTION

The present invention relates generally to semiconductor technology, and more particularly, to semiconductor capacitors.

BACKGROUND OF THE INVENTION

For decades, capacitors have been an important and irreplaceable circuit element used often in semiconductor circuit designs. For example, capacitors are widely used in applications such as dynamic random access memory (DRAM), active and passive filters, analog-to-digital and digital-to-analog converters (A/D and D/A converters, respectively), operational amplifiers, radio and tuning circuits, oscillators and multivibrator circuits, time critical and time delay circuitry, noise reduction circuitry, charge pumps, power electronics, and many other diverse applications. A capacitor is defined in the simplest terms as a device consisting of two conducting surfaces separated by an insulating material. A capacitor stores electrical energy or charge, blocks the flow of direct current (DC), and permits the flow of alternating current (AC) depending essentially upon the capacitance of the device and the frequency of the incoming current or charge. Capacitance, measured in farads, is determined by three physical characteristics: (1) a thickness or average thickness of the insulating material separating the two conducting surfaces; (2) how much surface area is covered by the two conducting surfaces; and (3) various mechanical and electrical properties of the insulating material and the two conducting plates or electrodes.

In the early development and marketing of the above mentioned technologies, parallel plate or parallel electrode capacitors were used as a capacitance structure. The parallel electrode capacitor is a capacitor that has a planar top and a planar bottom conducting surface separated by a planar dielectric or insulator. Because the parallel electrode capacitor is completely planar, large surface areas of substrate material or substrate-overlying layers of material are consumed to achieve capacitance values in a useful nanofarad or picofarad range.

DRAM memory cell substrate area reduction is very critical in order to achieve device densities that allow for a DRAM circuit with a large amount of memory cells. To achieve DRAM memory circuits with a million bits of storage or more, the industry developed a trench capacitor. The trench capacitor is formed by first etching a deep well, trench, or hole in a substrate surface or a surface overlying the substrate surface. This trench or hole is then used to form and contain two electrodes separated by an insulator. Because sidewalls of the trench or hole provide surface area to the capacitor without consuming more substrate surface area, the trench capacitor reduced capacitor substrate surface area and reduced the size of standard DRAM memory cells. Although trenches resulted in reductions in surface area, other methods described below are usually more efficient in enabling the manufacture of DRAM memory cells with reduced substrate area.

In order to achieve further reduction in DRAM cell sizes the industry developed a fin capacitor. The fin capacitor is formed by creating a first electrode overlying the substrate surface which resembles a vertically oriented comb-like structure. A central vertical pillar or spine of conducting material electrically connects to several horizontally positioned fins or planes of conducting material to form the comb-like structure. A second electrode is formed overlying the substrate in a vertical comb-like structure similar to the first electrode. The one difference between the two comb-like structures is that the fins of the first structure separate the fins of the second structure, or in other words, the fins from the two structures are intertwined thereby maximizing the surface area that the fins contribute to device capacitance. The fin capacitor device tended to be very complex and also limiting due to its geometric shape and fabrication scheme.

The semiconductor industry, in order to further improve the area savings and reduce overlying layer complexity, developed a "double box" capacitor and a few other vertically raised capacitors. The double box capacitor is created by lithographically forming a first box of conductive material with four sides. The four sides of this first box, which rise vertically above the surface of the substrate, surround another solid vertical lithographically-defined second box of conductive material. The first and second boxes are electrically connected to form a bottom electrode. An insulator covers the first and second boxes, and an overlying conductive layer forms the second capacitor electrode. In addition, structures similar to the double box capacitor have been taught. For example, U.S. Pat. No. 5,047,817, issued in September, 1990, by Wataru Wakamiya et al, entitled, "Stacked Capacitor for Semiconductor Memory Device," teaches a vertically raised capacitance structure.

Although the capacitors mentioned above offer surface area savings, they are: (1) limited by lithography; (2) in most cases lithographically intensive; (3) not space efficient enough for future memory generations; (4) result in topographical problems due to large vertical differences in height across the capacitive devices; and (5) tend to be mechanically more unstable as topography increases and therefore less manufacturable.

SUMMARY OF THE INVENTION

The previously mentioned needs are fulfilled and other advantages achieved with the present invention. In one form, the present invention comprises a method of forming a nested surface capacitor. A substrate material is provided and an insulating layer of material is formed overlying the substrate material. A first layer of conductive material is formed overlying the insulator. A second layer of material is formed overlying the first layer of conductive material and is patterned to define a location and a shape for the nested surface capacitor. A third layer of material, which is conductive, is formed overlying the first and second layers. The third layer of conductive material making electrical contact to the first layer of conductive material. A fourth layer of material is formed overlying and conformal to the third layer of material and selectively removed to form a first sidewall spacer adjacent to the third layer of material. A portion of the third and first layers of material are removed to expose a portion of the insulator. Remaining portions of the second and fourth layers of material are removed to form a central geometric cylinder of the capacitor from the third layer of material. A fifth layer of material is formed conformal to remaining portions of the first and third layers of material. Portions of the fifth layer of material are removed, to form a second and third sidewall spacer adjacent the third layer of material. A sixth layer of conductive material is formed conformal to remaining portions of the first and third layers of material and the second and third sidewall spacers. Portions of the sixth layer of material are removed to expose a predetermined portions of the second and third sidewall spacers. The second and third sidewall spacers are removed to completely define an outer and an inner geometric cylinder of the capacitor from the sixth layer of material. The outer and inner geometric cylinders are separated from each other by the central geometric cylinder. A seventh layer of dielectric material is formed overlying all exposed surfaces. An eighth layer of material is formed overlying the seventh layer of dielectric material to complete the formation of the nested surface capacitor.

The present invention will be understood by one skilled in the art from the detailed description below in conjunction with the accompanying drawings.

DESCRIPTION OF THE PREFERRED EMBODIMENT

Figure 1A:
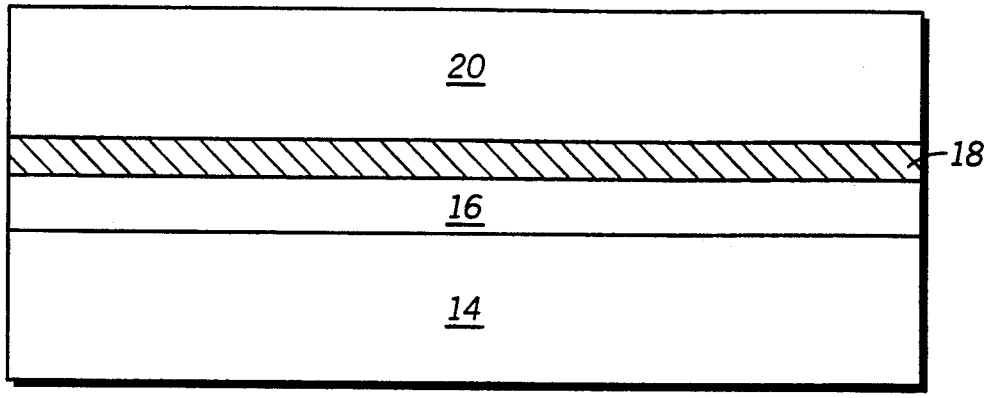
FIGS. 1A–1L illustrate, in cross-sectional form, a process for fabricating a nested surface capacitor in accordance with the present invention.

Illustrated in FIGS. 1A–1L is a nested surface capacitor fabrication process in accordance with the present invention. FIG. 1A illustrates a substrate 14 which can be any semiconductive substrate material such as silicon, germanium, an epitaxial formation, gallium-arsenide, silicon on sapphire, or the like. For most semiconductor applications the substrate 14 will be made of silicon. Overlying substrate 14, which is assumed to be silicon hereafter, is an insulator or a dielectric layer 16 that can be made from tetra-ethyl-ortho-silicate (TEOS) processing, borophosphate-silicate-glass (BPSG), phosphate-silicate-glass (PSG), thermally grown silicon dioxide, nitride, oxide-nitride-oxide (ONO), or a like dielectric material. Overlying the dielectric layer 16 is a first layer of material referred to as a conductive layer 18 which can be made from any conductive or semiconductive material. Overlying conductive layer 18 is a second layer of material referred to as a layer 20 which can be made from any insulating material, such as those mentioned above for dielectric layer 16, or any other material which can be removed selective to conductive layer 18.

Figure 1B:
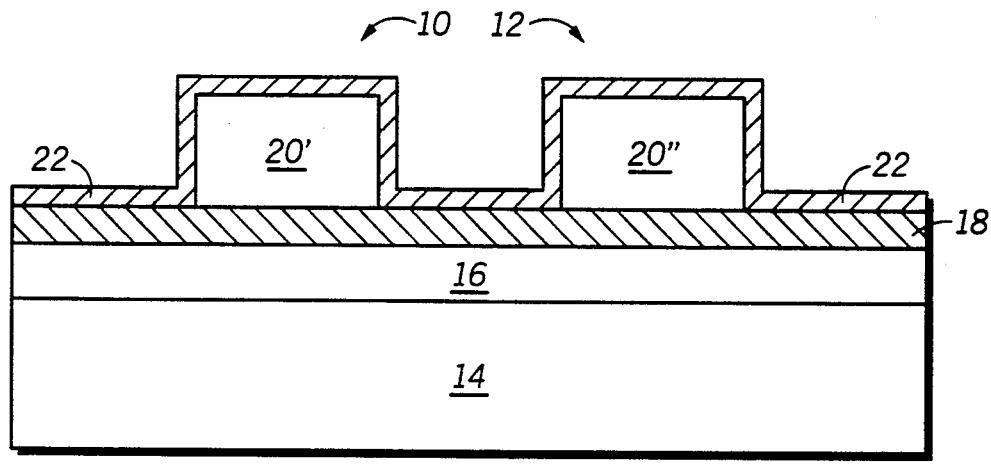

Portions of the layer 20 are removed or etched away to form a region 20' and a region 20" as illustrated in FIG. 1B. A first nested surface capacitor will be formed from an area overlying and surrounding region 20'. A second nested surface capacitor will be formed from an area overlying and surrounding region 20". The first and second nested surface capacitors are hereafter referred to as device 10 and device 12, respectively. Although FIGS. 1A–1L illustrate two nested surface capacitors, any number of capacitors including single isolated capacitors can be formed at any predetermined distance from each other.

Conventional lithographic techniques are used to define regions 20' and 20". It is important to note that the lithographic techniques used to form regions 20' and 20" are the only necessary lithographic steps needed to form the entire nested surface capacitor structures of FIGS. 1A–1L. Other lithographic steps could be added for a more complex nested surface capacitor process although these additions are not required. The regions 20' and 20" define a physical location and a three-dimensional shape for the nested surface capacitors respectively referred to as devices 10 and 12. The most common and useful shapes for the nested surface capacitor are circular or rectangular, but almost any geometric shape is possible. A third layer of material referred to as conductive layer 22 is formed overlying layers 20' and 20" and any exposed portions of conductive layer 18. The conductive layers 22 and 18 are physically and electrically connected.

Figure 1C:
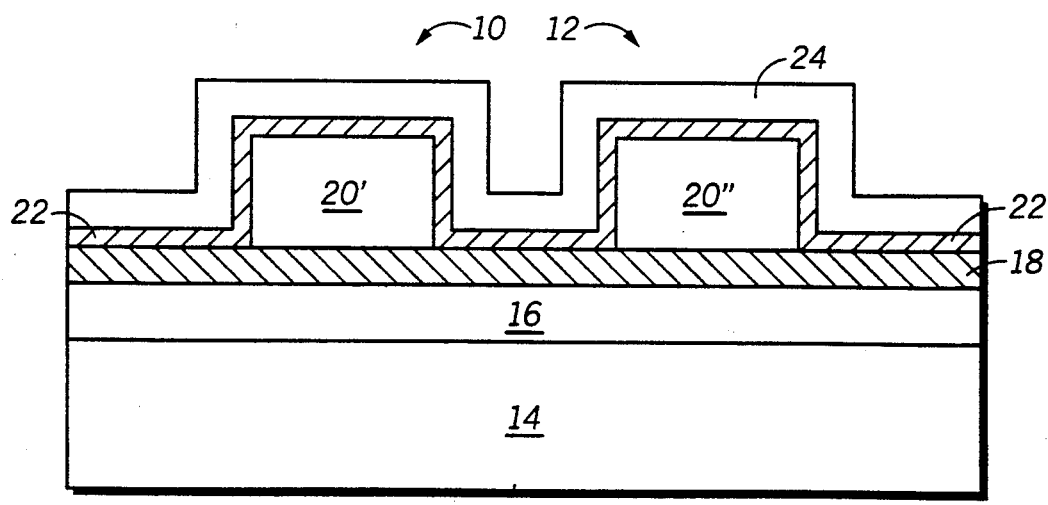
Figure 1D:
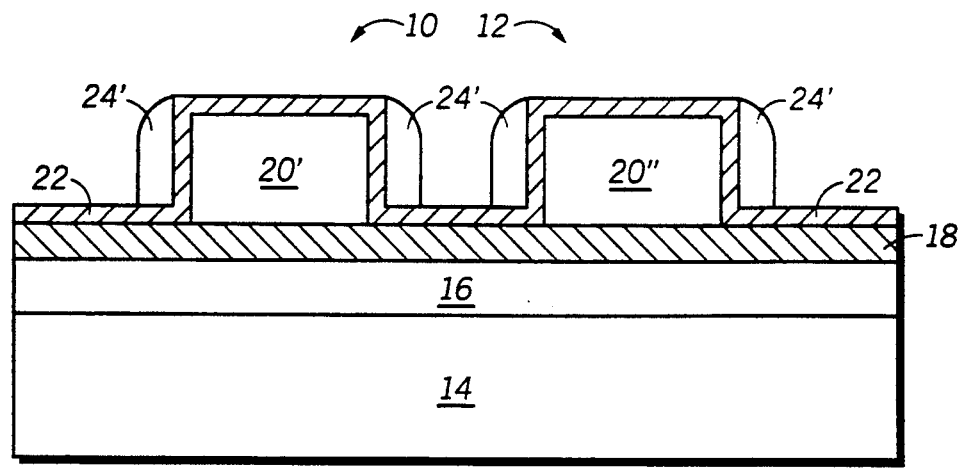

A fourth layer of material referred to as dielectric layer 24 is formed by growth, deposition, or a like process, and overlies conductive layer 22 as illustrated in FIG. 1C. Portions of dielectric layer 24 are removed, usually by conventional spacer etch technology, to form a first sidewall spacer referred to as spacer 24' which surrounds each of the regions 20' and 20" and is adjacent conductive layer 22 as illustrated in FIG. 1D.

Figure 1E:
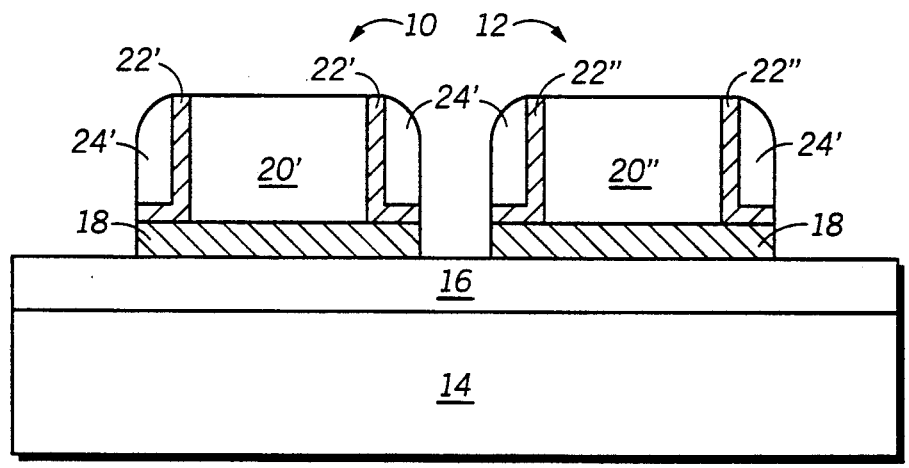

Portions of conductive layers 22 and 18 are removed or etched to expose portions of dielectric layer 16 and regions 20' and 20" as depicted in FIG. 1E. This etch step will electrically isolate device 10 from device 12. A reactive ion etch (RIE) is usually performed to accomplish this etch step, and the etch can be performed without the need of a mask layer.

Figure 1F:
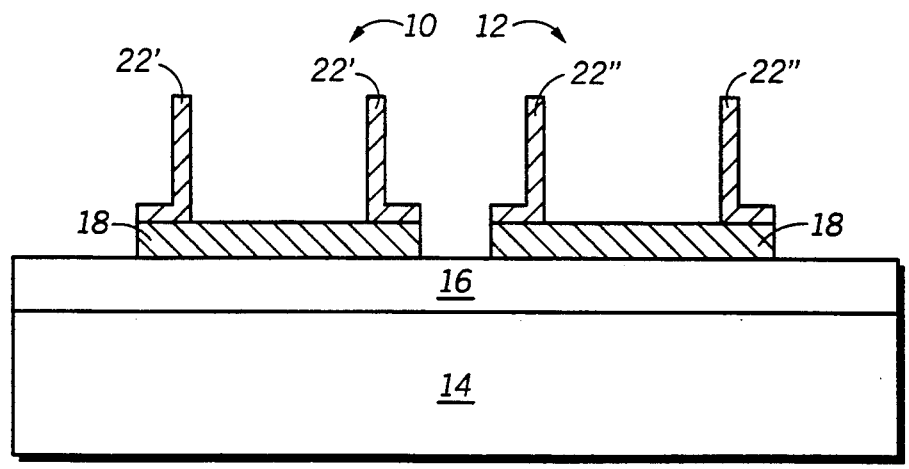

An anisotropic or similar etch is used to remove the regions 20' and 20" and spacer 24' as illustrated in FIG. 1F. The removal of regions 20' and 20" results in the formation of central geometric cylinders or free-standing three-dimensional cylinders of material referred to as a cylinder 22' and a cylinder 22". The cylinders 22' and 22" appear to be two separate "L" shaped regions in FIG. 1F. Actually, the two "L" shaped regions connect to each other in front of the two-dimensional plane of the figure and behind the two-dimensional plain of the figure to form three-dimensional cylinders. A subsequent figure will better illustrate the three-dimensional nature of device 10 and device 12.

Figure 1G:
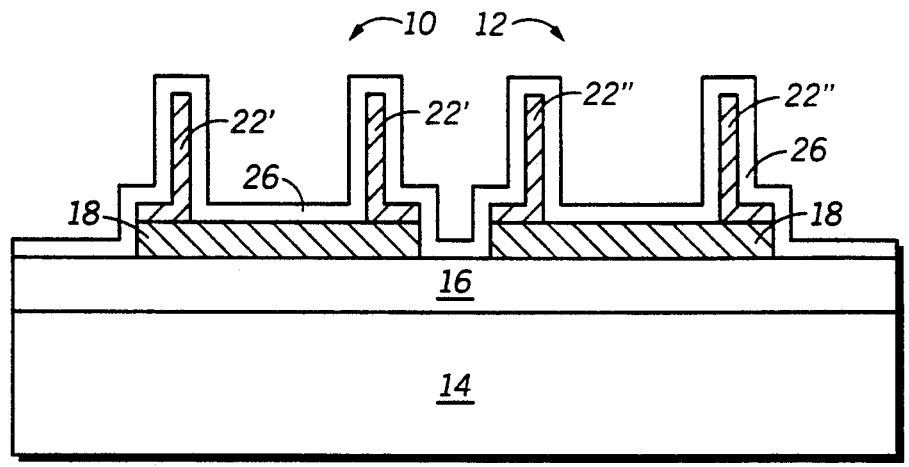
Figure 1H:
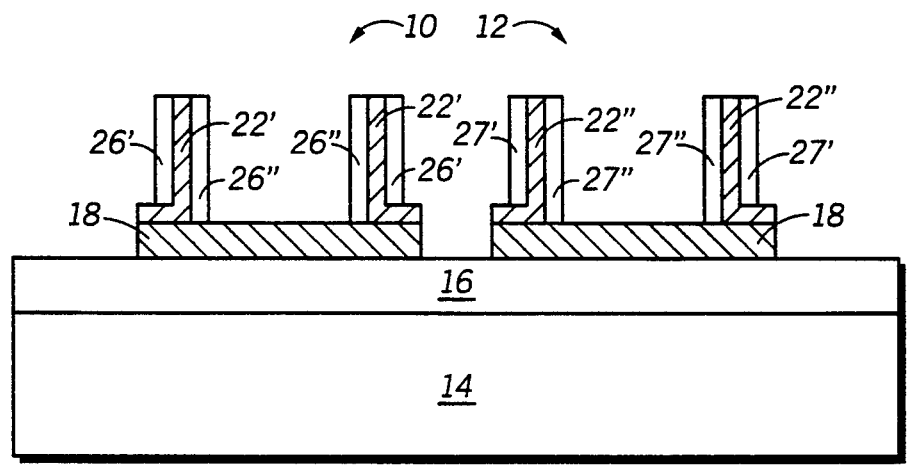

A fifth layer of material, referred to as a dielectric layer 26, is formed by growth, deposition, or a similar method, and is formed conformal to remaining portions of conductive layer 18 and cylinders 22' and 22" as illustrated in FIG. 1G. Portions of layer 26 are etched using conventional spacer etch technology to form second and third spacers as illustrated in FIG. 1H. The second and third spacers for device 10 are respectively referred to as spacers 26' and 26". The second and third spacers for device 11 are referred to as spacers 27' and 27". The spacers 26' and 27' from spacers in a cylindrical shape around the outer surface of cylinder 22' and 22", respectively. The spacers 26" and 27" form spacers in a cylindrical shape around the inner surface of cylinder 22' and 22", respectively.

Figure 1I:
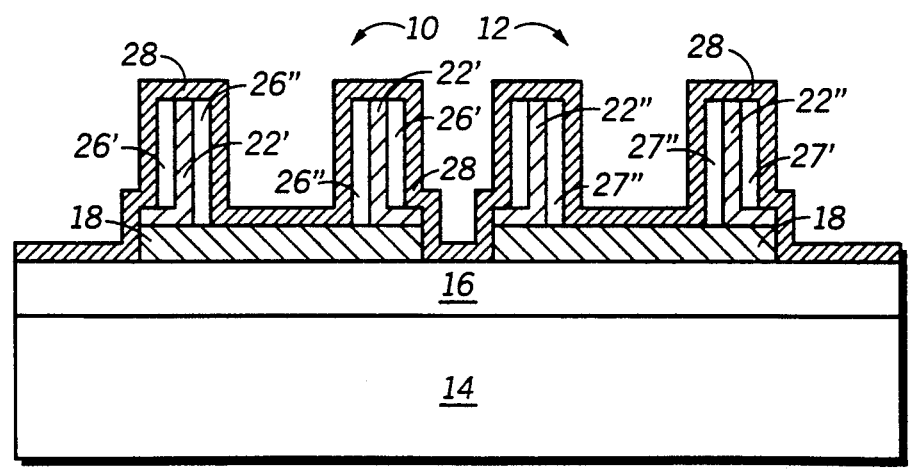
Figure 1J:
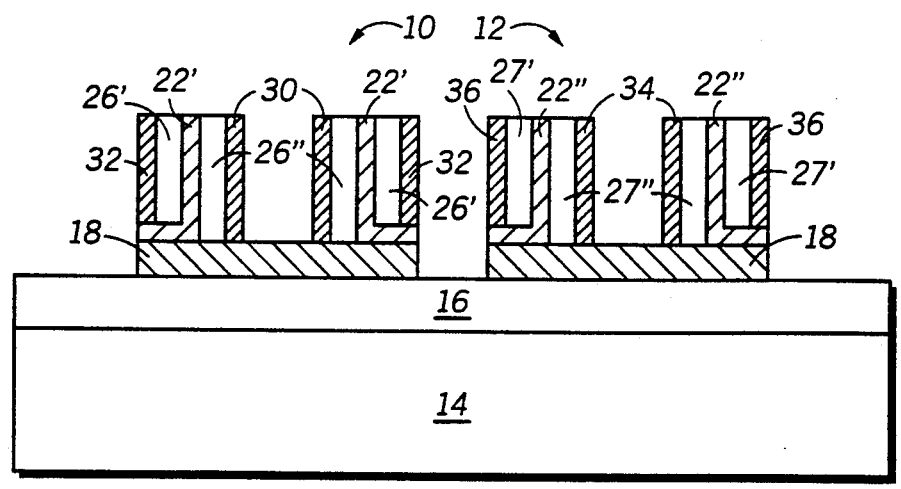

A sixth layer of material referred to as a conductive layer 28 is formed overlying and conformal to dielectric layer 16, conductive layer 18, conductive layer 22', and spacers 26', 26", 27', and 27" as depicted in FIG. 1I. Portions of conductive layer 28 are removed by spacer etch processing to expose spacers 26', 26", 27', and 27". This removal forms a pair of cylindrical spacers, referred to as cylinders 30 and 32 for device 10, and a pair of cylindrical spacers referred to as cylinders 34 and 36 for device 12, as illustrated in FIG. 1J. For device 10, cylinder 22' is a central cylinder of one electrode of the nested surface capacitor. Cylinder 32 is an outer cylinder which surrounds cylinder 22', and cylinder 30 is an inner cylinder that lies entirely within cylinder 22'. For device 12, cylinder 22" is a central cylinder of one electrode of the nested surface capacitor. Cylinder 36 is an outer cylinder which surrounds cylinder 22", and cylinder 34 is an inner cylinder that lies entirely within cylinder 22". All of the cylinders 22', 22", 30, 32, 34, and 36 form an outer geometric surface that will contribute to a surface area of one electrode of the nested surface capacitor.

The spacers 26', 26", 27', and 27" are removed by conventional etch processing which results in cylinders 22', 22", 30, 32, 34, and 36 being free-standing. Because spacers are used to define the outer and inner cylinders, referred to as cylinder 32 and 30, respectively, for device 10 and cylinders 36 and 34, respectively, for device 12, lithography limitations are reduced. The specific lithographic limitations that are overcome are discussed later specification using a top plan view.

Figure 1K:
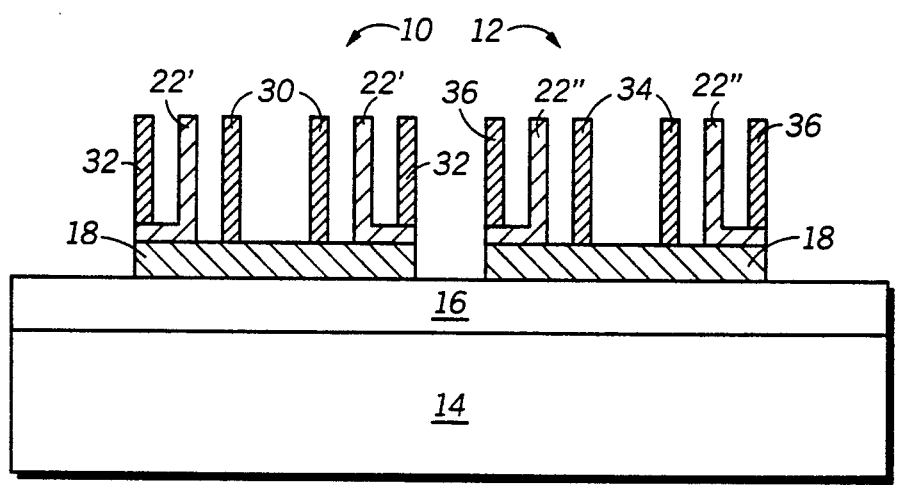
Figure 1L:
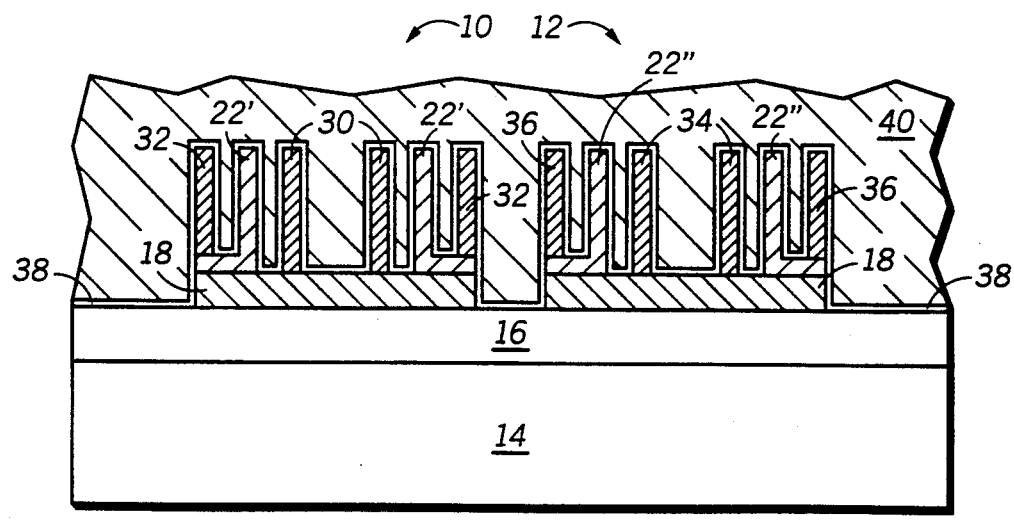

A grown or deposited seventh layer of material, referred to as a dielectric layer 38, is formed overlying a lower electrode of the nested surface capacitor as illustrated in FIG. 1L. The lower electrode includes conductive layer 18, and cylinders 32, 22', and 32 for device 10. A similar lower electrode exists for device 12. Dielectric layer 38 is the dielectric of the nested surface capacitor that will separate two capacitor electrodes. The dielectric layer 38 should be as thin as possible and should have a high dielectric constant, if possible, to achieve a higher capacitance. Logical choices for dielectric layer 38 are silicon dioxide, oxide-nitride-oxide (ONO), or high dielectric constant materials, such as tantalum pentoxide ($Ta_2O_5$).

A second electrode or upper electrode of the nested surface capacitor is formed by an eighth layer of material referred to as a conductive layer 40 which overlies dielectric layer 38. Therefore, devices 10 and 12 are nested surface capacitors with large capacitive surface areas as evident from the large surfaces of the cylinders 22', 22", 30, 32, 34, and 36, and conductive layer 40. Although a large capacitive surface area is achieved, devices 10 and 12 do not consume much substrate surface area. The resulting devices 10 and 12 are capacitors that are: (1) not limited by lithography for some critical feature sizes; (2) not lithographically intensive (devices 10 and 12 can be manufactured with only one conventional mask/photo sequence); (3) more space efficient than conventional technology and applicable to future memory generations; (4) less likely to create topographical problems due to the fact that smaller vertical differences in height across the capacitor can still achieve large capacitances when compared to conventional capacitors; and (5) more mechanically stable and more manufacturable due to less vertical topography and as more robust, mechanically stronger shape.

Figure 2:
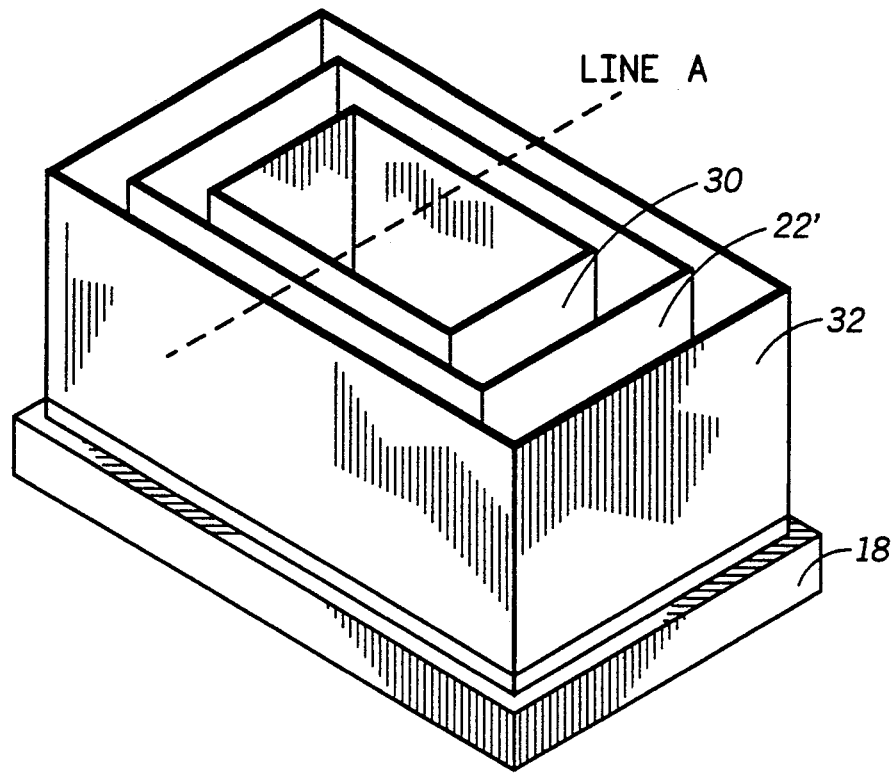
FIG. 2 illustrates, in three-dimensional perspective view, a nested surface capacitor structure in accordance with one form of the present invention.

FIG. 2 illustrates, in three-dimensional perspective view, a lower electrode configuration similar to that used for device 10 and device 12. Regions of FIG. 2 are identically labeled to analogous elements of device 10 of FIG. 1K in order to correlate the two figures. FIG. 2 illustrates the cylindrical nature of the inner, central, and outer cylinders when a rectangular capacitor shape is desired. In FIG. 2 and FIG. 1K, the conductive layer 18, the inner cylinder 30, the central cylinder 22' and the outer cylinder 32 are illustrated. FIG. 2 could be cross-sectioned down the line A and look identical to device 10 or 12 of FIG. 1K.

Figure 3A:
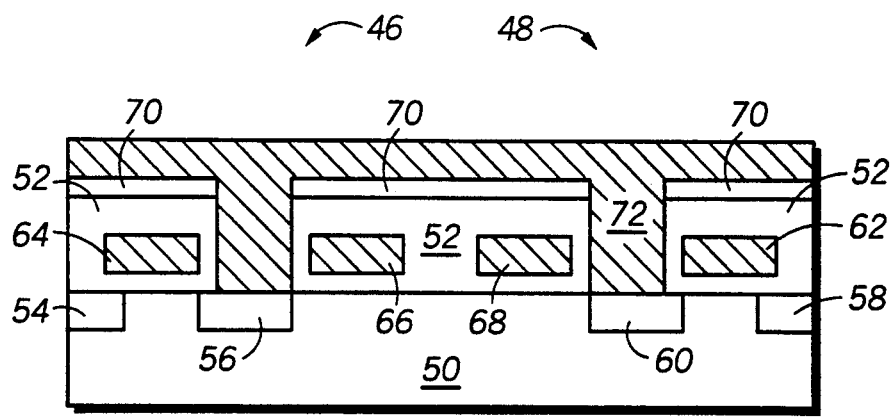
FIGS. 3A–3G illustrate, in cross-sectional form, a process for fabricating a nested surface capacitor for use in a DRAM cell in accordance with the present invention.

Although the devices 10 and 12 can be used in almost any application that requires a capacitive device, nested surface capacitors are most useful for DRAM applications where substrate surface area savings is a primary concern. Illustrated in FIGS. 3A-3G are nested surface capacitor devices similar to device 10 and device 12 which are used in a DRAM application. In FIG. 3A, only two DRAM bits of memory or memory cells 46 and 48 are illustrated side by side. It should be noted that any number of DRAM memory cells, even single isolated cells, could be manufactured using the same process flow described herein.

FIG. 3A illustrates a substrate 50 wherein four diffusion regions respectively referred to as a source 54, a drain 56, a source 58, and a drain 60 are located. A transistor gate for source 54 and drain 56 is referred to as a row line 64. A transistor gate for source 58 and drain 60 is referred to as a row line 62. Row lines for other neighboring DRAM bits, referred to as row lines 66 and 68, are formed lying between the two DRAM cells 46 and 48. A dielectric layer 52 isolates both the bit lines 64 and 62 and the word lines 66 and 68 from the substrate 50. A layer 70 is deposited overlying dielectric layer 52, and layer 70 usually helps the selectivity of removal or etch steps that follow later in the process flow of FIG. 3. A conductive layer 72 is formed overlying layer 70 and makes electrical contact to drain 56 and drain 60. Conductive layer 72 functions in a similar manner to conductive layer 18 of FIG. 1 and FIG. 2. It should be noted that the following process flow, specifically FIGS. 3B-3G, is very similar to FIG. 1, specifically FIGS. 1B-1L, and therefore the remaining figures of FIG. 3 are described briefly. Although devices 46 and 48 are described briefly, the nested surface capacitors that are a part of device 46 and device 48 may be varied the same as described for devices 10 and 12.

Figure 3B:
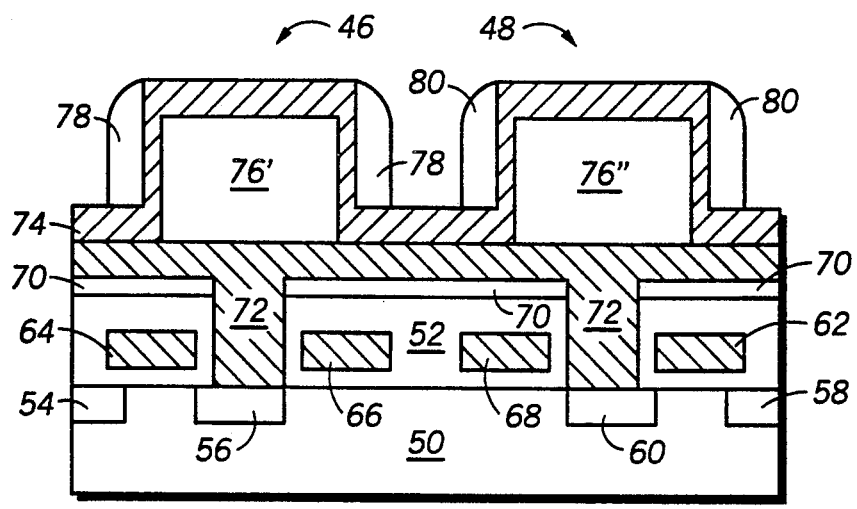

A layer of material (not numbered) is formed overlying conductive layer 72 as illustrated in FIG. 3B. This layer of material is patterned by photolithographical techniques and removed to form regions 76' and 76". Regions 76' and 76" respectively define a location and shape for the nested surface capacitors of devices 46 and 48. A conductive layer of material is formed overlying regions 76' and 76" and conductive layer 72. Cylindrical spacers 78 and 80 are formed adjacent conductive layer 74 and occupy a cylindrical region respectively surrounding regions 76' and 76".

Figure 3C:
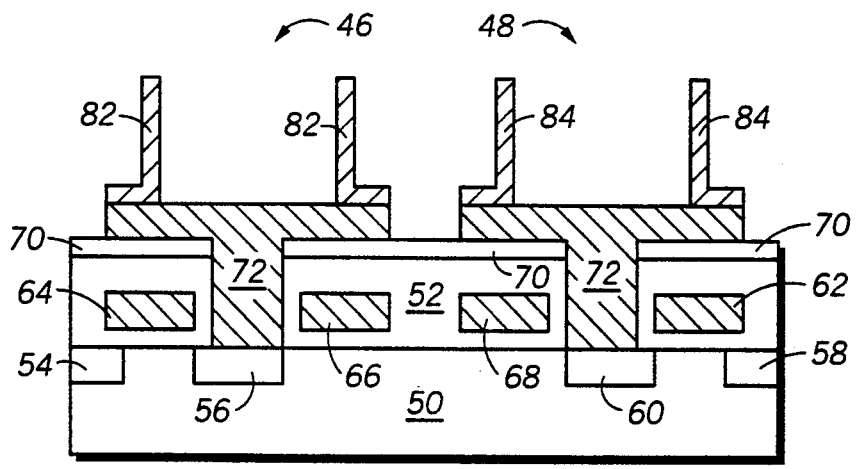

Portions of the conductive layer 74 are removed to expose the underlying regions 76' and 76", and the regions 76' and 76" and the spacers 78 and 80 are removed. These removal processes form the central electrode cylinders 82 and 84 for devices 46 and 48, respectively, as depicted in FIG. 3C. The removal steps for conductive layer 74, spacers 78 and 80, and regions 76' and 76" also remove portions of conductive layer 72 to isolate the nested surface capacitors of device 46 and 48 from each other and from other devices.

Figure 3D:
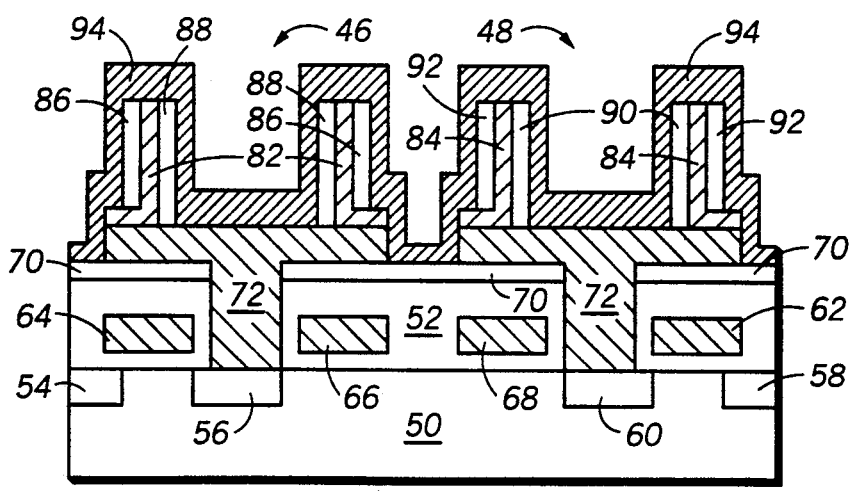
Figure 3E:
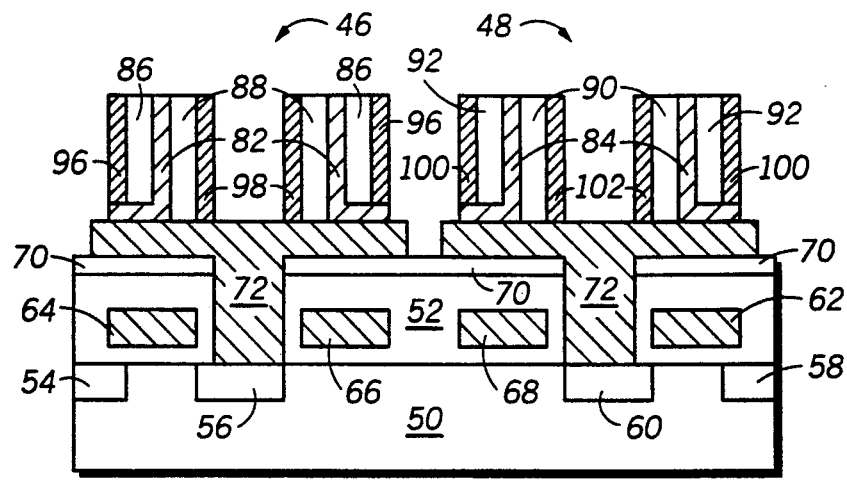
Figure 3F:
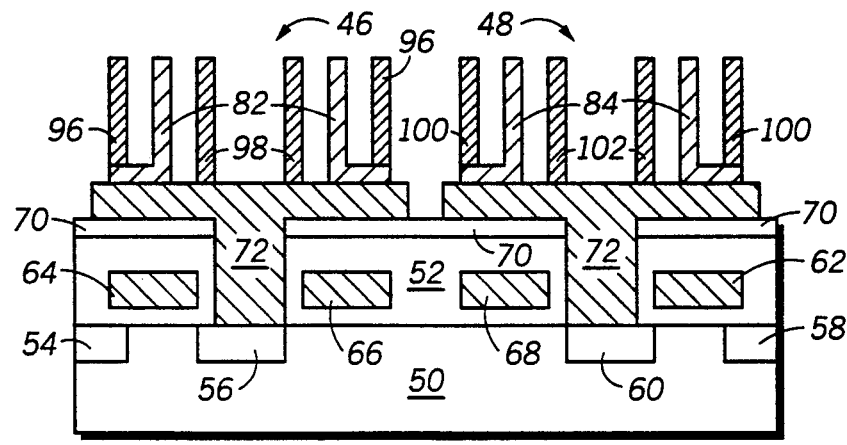

A conformal dielectric layer of material (not numbered) is deposited overlying the cylinders 82 and 84, and conductive layer 72. Portions of the conformal dielectric layer are removed to form cylindrical spacers 86 and 88 for device 46 and cylindrical spacers 90 and 92 for device 48 as illustrated in FIG. 3D. A conductive layer 94 is formed overlying the conductive layer 72, the spacers 86, 88, 90 and 92 and the cylinders 82 and 84. Portions of the conductive layer 94 are removed forming inner cylinders 98 and 102 for devices 46 and 48 respectively and forming outer cylinders 96 and 100 for devices 46 and 48 respectively as illustrated in FIG. 3F. One electrode of the nested surface capacitors of device 46 and device 48 are now completely formed. One electrode for device 46 is formed by conductive layer 72 and cylinders 82, 96 and 98. One electrode for device 48 is formed by conductive layer 72 and cylinders 84, 100 and 102.

Figure 3G:
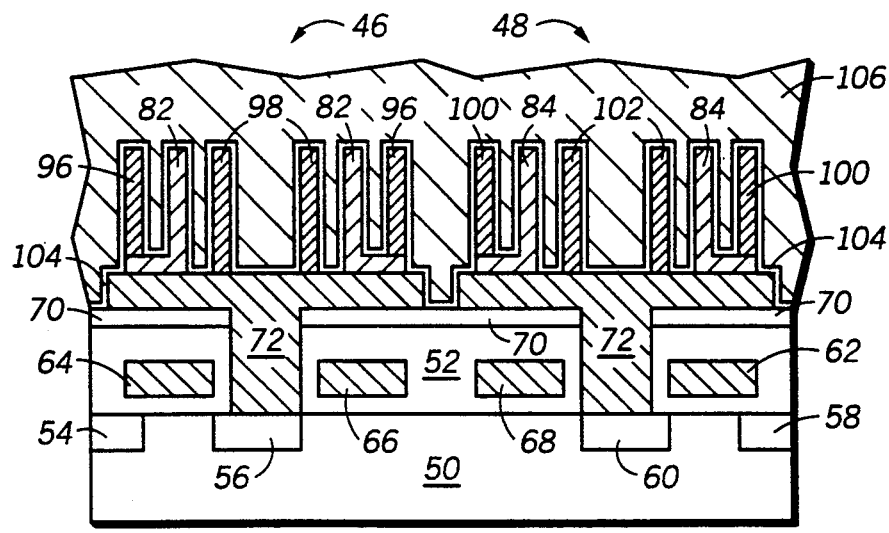

A thin dielectric layer 104 is formed overlying conductive layer 72 and cylinders 82, 84, 96, 98, 100 and 102 as illustrated in FIG. 3G. A conductive layer 106 is formed overlying the dielectric layer 104 and forms a second and final electrode for the nested surface capacitors for devices 46 and 48. Conductive layer 106 is usually connected to a power supply for DRAM applications.

Figure 4:
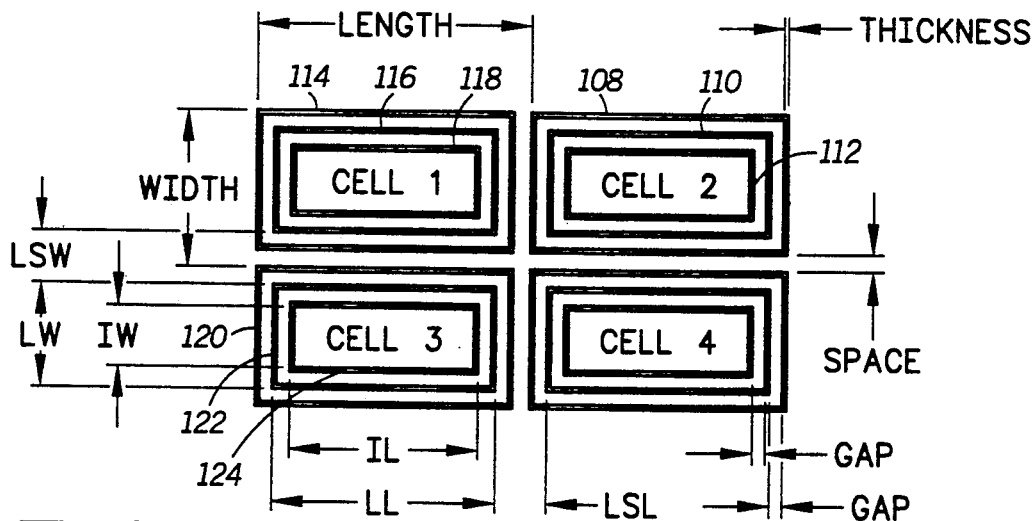
FIG. 4 illustrates a top plan view of four adjacent nested surface capacitors in accordance with the present invention.

FIG. 4 illustrates in a top plan view four adjacent nested box capacitors which are similar to devices 10, 12, 46, and 48. The four nested surface capacitors are labeled "Cell 1", "Cell 2", "Cell 3" and "Cell 4". "Cell 1", Cell 2" and "Cell 3" each have inner, central, and outer cylinders that are labeled. The cells, illustrated for "Cell 1", have a "LENGTH" and a "WIDTH". The "LENGTH and "WIDTH" dimensions for the inventive device are much smaller than conventional lithographically-limited capacitor cells.

The outer cylinders are labeled 108, 114, and 120, the central cylinders are labeled 110, 116, and 122, and the inner cylinders are labeled 112, 118, and 124 in FIG. 4. There is only one photolithographic step in the entire inventive process, and that photolithographic step is used to define the central cylinders 110, 116, and 122. Therefore, the only lithographically defined dimensions of the four nested capacitors are a length and a width of the central cylinders 110, 116, and 122, and their separation. The length and width of the central cylinders are illustrated and respectively labeled as "LW" (lithographic width) and "LL" (lithographic length). Lithographic capabilities also limit the separation of the central cylinders 110, 116, and 122. The central cylinders 110, 116, and 122 cannot be formed any closer to each other than a minimum distance illustrated and labeled as "LSL" and "LSW" (a lithographic spacing in the width and the length direction).

The outer cylinders and inner cylinders are formed by spacer technology. Spacer technology is not limited by photolithography, and therefore the distances from outer to central cylinders and the distance from central to inner cylinders, labeled in two places as "GAP", can be much smaller than photolithography allows. This also means that the separation between cells, labeled as "SPACE", can be smaller than photolithographic technology allows. The cylinders themselves are spacers and not photolithographic lines. Therefore, the thickness of the cylinders, illustrated and labled "THICKNESS", for any conductive cylinder, is determined by a deposited layer thickness and can be made extremely small. The dimensions of the inner cylinders, illustrated and labeled "IW" and "IL" (inner width and inner length respectively), may also smaller than lithography allows. Due to the fact that the inventive process is less limited by photolithography, the cell surface areas of the four nested surface capacitors are much smaller than the previously described known capacitor structures.

Figure 5:
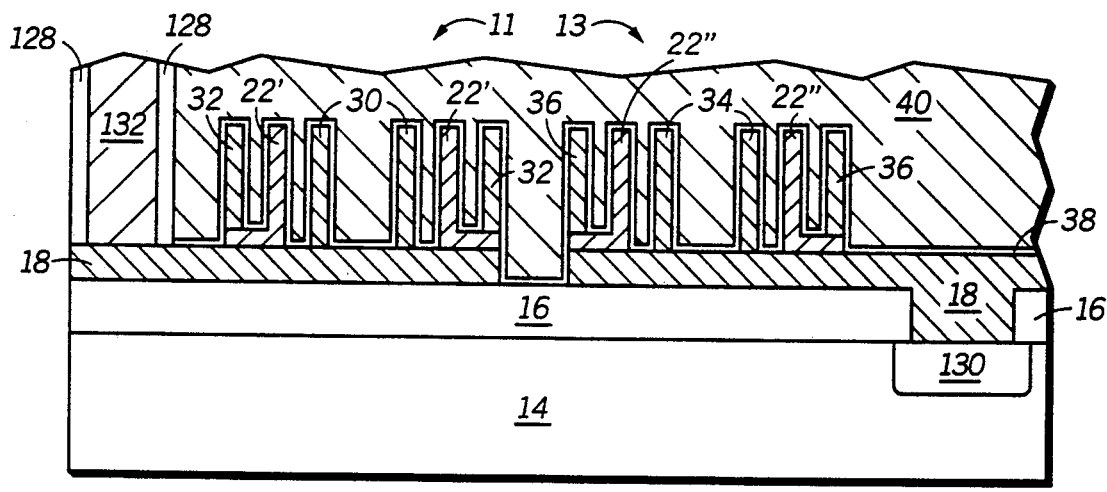
FIG. 5 illustrates, in cross-sectional form, alternative electrical connections to the nested surface capacitors of FIG. 1.

Illustrated in FIG. 5 are devices 11 and 13. Devices 11 and 13 are very similar to devices 10 and 12 in fabrication and structure. Therefore, regions and layers of material for devices 11 and 13 are labeled identically to devices 10 and 12, respectively. FIG. 5 illustrates two alternative ways to electrically contact a nested surface capacitor to other regions. Device 11, in FIG. 5, has a conductive layer 18 similar to that of each of device 10 and device 12. The only difference is that the conductive layer 18 of device 11 extends laterally over dielectric layer 16 to provide a contact area. An overlying conductive layer 132 makes electrical contact to the nested surface capacitor on the conductive layer 18 contact area. The overlying conductive layer 132 can be made of metal, polysilicon, or any other conductive or semiconductive material. The conductive layer 132 may be isolated from other conductive regions and layers by a dielectric layer 128.

Illustrated in FIG. 5 is a second nested surface capacitor referred to as device 13. Device 13 makes electrical contact to a diffusion or to the substrate through a diffusion 130. Contact is made from device 13 to the diffusion 130 via the conductive layer 18. Other methods such as sidewall contacts, shared contacts, buried contacts, epitaxial growth, and other process flows can form connections to the nested surface capacitors taught herein.

Figure 6:
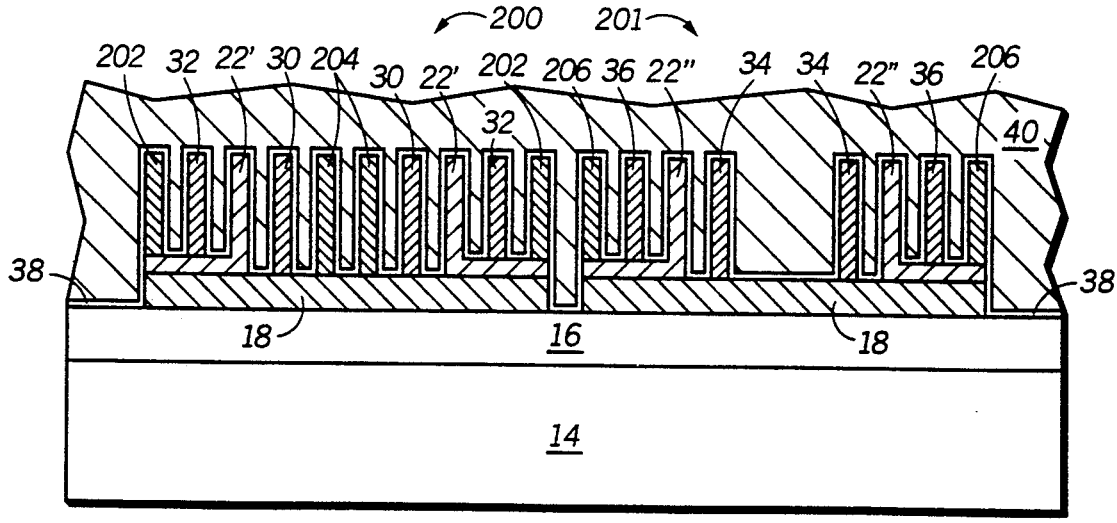
FIG. 6 illustrates alternative formations which can be used as lower electrodes for a nested surface capacitor.

FIG. 6 illustrates alternative formations which can be used as lower electrodes for a nested surface capacitor. Theoretically unlimited odd (i.e. five, seven, nine) numbers of cylinders can be formed by repeating the steps of FIGS. 1H–1K for devices 10 and 12 of FIG. 1. Even (i.e. four, six, eight) numbers of cylinders can be formed around a central cylinder by preventing spacer formation on an inner or an outer perimeter of an existing cylinder. Device 200 is a nested surface capacitor which has five total cylinders that together form a lower electrode for the nested surface capacitor. Some regions and layers of FIG. 6, discussed below, are identically labeled to regions and layers of FIG. 1 for clarity. A central cylinder 22', for device 200, is surrounded by a plurality of conductive cylinders around both a central cylinder inner perimeter and a central cylinder outer perimeter. Cylinders surrounding the central cylinder outer perimeter are cylinders 32 and 202, and cylinders surrounding the central cylinder inner perimeter are cylinders 30 and 204.

Device 201, of FIG. 6, illustrates an even-numbered cylinder-formed lower electrode structure. A central cylinder 22" is formed having a central cylinder outer perimeter and a central cylinder inner perimeter. Cylinders 36 and 206 surround the central cylinder outer perimeter and a cylinder 34 surrounds a central cylinder inner perimeter. Only one cylinder, referred to as cylinder 34, is located within cylinder 22" because a second cylinder formation was prevented by a mask layer or a like technique. FIG. 6, in general, illustrates iterative methods of cylinder formation that can be used for any lower electrode formation of any nested surface capacitor described herein.

While the present invention has been illustrated and described with reference to specific embodiments, further modifications and improvements will occur to those skilled in the art. For example, many different materials can be used for capacitor electrodes, capacitor dielectrics, and other regions and layers. The nested surface capacitor can be used in many applications and other technology can be added to the nested surface capacitor, such as implantation of regions, epitaxial growth, diffusion technology, other forms of lithography such as X-ray lithography, more masking sequences, various contact structures, the use of multiple spacer technology to create a larger number of cylinders, and other processes. It is to be understood, therefore, that this invention is not limited to the particular forms illustrated and that it is intended in the appended claims to cover all modifications that do not depart from the spirit and scope of this invention.

I claim:

1. A method of forming a nested surface capacitor, comprising the steps of:

providing a substrate material;

forming an insulator overlying the substrate material;

forming a first layer of material overlying the insulator, the first layer of material being conductive;

forming a second layer of material overlying the first layer of conductive material;

patterning the second layer of material to define a location and shape for the capacitor;

forming a third layer of material overlying the first and second layers, the third layer being conductive and making electrical contact to the first layer of material;

forming a fourth layer of material overlying and conformal to the third layer of material and selectively removing the fourth layer of material to form a first sidewall spacer adjacent the third layer of material;

removing a portion of the third and first layers of material to expose a portion of the insulator;

removing remaining portions of the second and fourth layers of material to form a central geometric cylinder of the capacitor from the third layer of material;

forming a fifth layer of material conformal to remaining portions of the first and third layers of material;

removing portions of the fifth layer of material to form second and third sidewall spacers adjacent the third layer of material;

forming a sixth layer of material conformal to remaining portions of the first and third layers, and the second and third sidewall spacers, the sixth layer of material being conductive;

removing potions of the sixth layer of material to expose a selected portion of the second and third sidewall spacers;

removing the second and third sidewall spacers to define an outer geometric cylinder and an inner geometric cylinder of the capacitor from the sixth layer of material, the inner and outer geometric cylinders being separated from each other by the central geometric cylinder, the step of removing the second and third sidewall spacers forming both a first separation region between the inner geometric cylinder and the central geometric cylinder and a second separation region between the outer geometric cylinder and the central geometric cylinder;

forming a seventh layer of material overlying all exposed surfaces, the seventh layer of material being a dielectric; and forming an eighth layer of conductive material overlying the seventh layer of material to complete formation of the capacitor.

2. The method of forming the nested surface capacitor of claim 1 further comprising the steps of:

forming a conductive region within the substrate material;

forming an opening to expose the conductive region; and filling the opening with a layer of conductive material to form electrical contact from the conductive region to any of the first, third, or sixth layers of material.

3. The method of forming the nested surface capacitor of claim 1 further comprising the step of concurrently forming a second nested surface capacitor using the method of claim 1 and being adjacent the nested surface capacitor formed by the method of claim 1, the second nested surface capacitor being separated from the nested surface capacitor of claim 1 by a dimension which is less than a minimum lithographic dimension required to pattern the second layer of material.

4. The method of forming the nested surface capacitor of claim 1 further comprising the steps of:

forming a contact region with any of the first, third, or sixth layers of material;

forming an overlying opening to expose the contact region; and filling the opening with a layer of conductive material to form an electrical contact to any of the first, third, or sixth layers of material.

5. The method of forming the nested surface capacitor of claim 1 wherein the steps of forming the first, third, sixth, and eighth layers of material further comprises forming the first, third, sixth, and eighth layers of material from polysilicon.

6. The method of forming the nested surface capacitor of claim 1 further comprising the step of forming a first periphery of one or more conductive cylinders surrounding the central geometric cylinder and forming a second periphery of one or more conductive cylinders which are surrounded by the central geometric cylinder.

7. A method of forming a nested surface capacitor, comprising the steps of:

providing a silicon substrate material;

forming an insulator overlying the substrate material;

depositing a first layer of material overlying the insulator, the first layer of material being polysilicon;

depositing a second layer of material overlying the first layer of conductive material, the second layer of material being a dielectric material;

patterning the second layer of material to define a location and shape for the capacitor;

depositing a third layer of material overlying the first and second layers, the third layer being polysilicon and making electrical contact to the first layer of material;

depositing a fourth layer of material overlying and conformal to the third layer of material and selectively removing the fourth layer of material to form a first sidewall spacer adjacent the third layer of material;

etching a portion of the third and first layers of material to expose a portion of the insulator;

etching remaining portions of the second and fourth layers of material to form a central geometric cylinder of the capacitor from the third layer of material;

depositing a fifth layer of dielectric material conformal to remaining portions of the first and third layers of material;

etching portions of the fifth layer of dielectric material to form second and third sidewall spacers adjacent the third layer of material;

depositing a sixth layer of material conformal to remaining portions of the first and third layers, and the second and third sidewall spacers, the sixth layer of material being polysilicon;

etching potions of the sixth layer of material to expose a selected portion of the second and third sidewall spacers;

removing the second and third sidewall spacers to complete defining an outer geometric cylinder and an inner geometric cylinder of the capacitor from the sixth layer of material, the inner and outer cylinders being separated from each other by the central geometric cylinder, the step of removing the second and third sidewall spacers physically separating the inner geometric cylinder from the central geometric cylinder and physically separating the outer geometric cylinder from the central geometric cylinder;

growing a seventh layer of material overlying all exposed surfaces, the seventh layer of material being a dielectric; and forming an eighth layer of conductive material overlying the seventh layer of material to complete formation of the capacitor.

8. The method of forming the nested surface capacitor of claim 7, further comprising the steps of:
doping a conductive region within the silicon substrate material;
etching an opening to expose the conductive region; and
forming electrical contact from the conductive region to any of the first, third, or sixth layers of material.

9. The method of forming the nested surface capacitor of claim 7 further comprising the step of concurrently forming a second nested surface capacitor using the method of claim 7 and being adjacent the nested surface capacitor formed by the method of claim 7, the second nested surface capacitor being separated from the nested surface capacitor of claim 7 by a dimension which is less than a minimum lithographic dimension required to pattern the second layer of material.

10. The method of forming the nested surface capacitor of claim 7 further comprising the steps of:
forming a contact region with a portion of any of the first, third, or sixth layers of material;
etching an overlying opening to expose the contact region; and
forming electrical contact from the conductive region to any of the first, third, or sixth layers of material.

11. The method of forming the nested surface capacitor of claim 7 further comprising the step of forming a first periphery of one or more polysilicon cylinders surrounding the central geometric cylinder and forming a second periphery of one or more polysilicon cylinders which are surrounded by the central geometric cylinder.

12. A method of forming a nested surface capacitor, comprising the steps of:
providing a silicon substrate;
forming a first dielectric layer overlying the silicon substrate;
forming a first conductive layer overlying the first dielectric layer;
forming a patterned layer overlying the first conductive layer, the patterned layer having a periphery;
forming a second conductive layer overlying the patterned layer and surrounding a portion of the periphery of the patterned layer, the portion of the periphery of the patterned layer forming a sidewall of the second conductive layer;
forming a first sidewall spacer laterally adjacent the sidewall of the second conductive layer;
removing portions of the patterned layer, the first sidewall spacer, and the second conductive layer to form a first cylindrical conductive region from the second conductive layer wherein the first cylindrical conductive region has an inner sidewall and an outer sidewall;
forming a second sidewall spacer laterally adjacent the inner sidewall of the first cylindrical conductive region;
forming a third sidewall spacer laterally adjacent the outer sidewall of the first cylindrical conductive region;
forming a second conductive cylindrical region adjacent the second sidewall spacer, the second sidewall spacer separating the second conductive cylindrical region from the first conductive cylindrical region, the second conductive cylindrical region being electrically coupled to the first conductive layer;
forming a third conductive cylindrical region adjacent the third sidewall spacer, the third sidewall spacer separating the third conductive cylindrical region from the first conductive cylindrical region, the third conductive cylindrical region being electrically coupled to the first conductive layer;
removing the second and third spacers to form a first capacitor electrode from the first conductive layer, the first conductive cylindrical region, the second conductive cylindrical region, and the third conductive cylindrical region;
forming a capacitor dielectric overlying the first capacitor electrode; and
forming a second capacitor electrode overlying the capacitor dielectric.

13. The method of claim 12 further comprising the steps of:
forming a transistor underlying the first capacitor electrode; and
electrically coupling the first capacitor electrode to the transistor to form a dynamic memory cell.

14. The method of claim 12 further comprising the steps of:
forming a transistor on the surface of the silicon substrate; and
electrically coupling the first capacitor electrode to the transistor to form a dynamic memory cell.

15. The method of claim 12 further comprising the step of:
forming a fourth conductive cylindrical region laterally adjacent the second conductive cylindrical region, the fourth conductive cylindrical region being electrically coupled to the first conductive layer.

16. The method of claim 15 further comprising the step of:

forming a fifth conductive cylindrical region laterally adjacent the third conductive cylindrical region, the fifth conductive cylindrical region being electrically coupled to the first conductive layer.

17. The method of claim 12 further comprising the step of:

forming a fourth conductive cylindrical region laterally adjacent the third conductive cylindrical region, the fourth conductive cylindrical region being electrically coupled to the first conductive layer.

* * * * *